US012648486B2

(12) United States Patent　　　　(10) Patent No.:　US 12,648,486 B2
Yu et al.　　　　　　　　　　　　　(45) Date of Patent:　　　Jun. 2, 2026

(54) PACKAGE-ON-PACKAGE HAVING A THICK LOGIC DIE

(71) Applicant: MEDIATEK INC., Hsin-Chu (TW)

(72) Inventors: Ta-Jen Yu, Hsinchu City (TW);
Wen-Chin Tsai, Hsinchu City (TW);
Isabella Song, Hsinchu City (TW);
Tai-Yu Chen, Hsinchu City (TW);
Che-Hung Kuo, Hsinchu City (TW);
Hsing-Chih Liu, Hsinchu City (TW);
Shih-Chin Lin, Hsinchu City (TW);
Wen-Sung Hsu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 335 days.

(21) Appl. No.: 18/203,631

(22) Filed: May 30, 2023

(65) Prior Publication Data

US 2023/0307421 A1　　Sep. 28, 2023

Related U.S. Application Data

(63) Continuation-in-part of application No. 18/107,520, filed on Feb. 9, 2023.

(Continued)

(51) Int. Cl.
　　*H10W 90/00*　　　　(2026.01)
　　*H10W 72/20*　　　　(2026.01)
　　*H10B 80/00*　　　　(2023.01)
(52) U.S. Cl.
　　CPC ........... *H10W 90/00* (2026.01); *H10W 72/20* (2026.01); *H10W 90/701* (2026.01); *H10B 80/00* (2023.02); *H10W 90/722* (2026.01)

(58) Field of Classification Search
　　CPC ........... H01L 25/0657; H01L 23/49816; H01L 24/17; H10W 90/701; H10W 90/00
　　See application file for complete search history.

(56) References Cited

U.S. PATENT DOCUMENTS

| 2004/0089943 A1 | 5/2004 | Kirigaya |
| 2005/0104217 A1 | 5/2005 | Narayan |

(Continued)

FOREIGN PATENT DOCUMENTS

| CN | 113410206 A | 9/2021 |
| KR | 10-1681028 B1 | 12/2016 |

(Continued)

OTHER PUBLICATIONS

Yu, the specification, including the claims, and drawings in the U.S. Appl. No. 18/203,666, filed May 31, 2023.

(Continued)

*Primary Examiner* — Errol V Fernandes
(74) *Attorney, Agent, or Firm* — Winston Hsu

(57) ABSTRACT

A package-on-package includes a first package and a second package on the first package. The first package includes a bottom substrate and a top substrate space apart from the bottom substrate such that the bottom substrate and the top substrate define a gap therebetween. A logic die and an IC device are mounted on the bottom substrate in a side-by-side configuration. The logic die has a thickness not less than 125 micrometer. Copper cored solder balls are disposed between around the logic die and the IC device to electrically connect the bottom substrate with the top substrate. A sealing resin is filled into the gap between the bottom substrate and the top substrate and seals the logic die, the IC device, and the copper cored solder balls in the gap.

12 Claims, 4 Drawing Sheets

Related U.S. Application Data

(60) Provisional application No. 63/354,361, filed on Jun. 22, 2022, provisional application No. 63/354,363, filed on Jun. 22, 2022, provisional application No. 63/316,004, filed on Mar. 3, 2022.

(56) References Cited

U.S. PATENT DOCUMENTS

| | | |
|---|---|---|
| 2014/0151867 A1 | 6/2014 | Lin |
| 2016/0172292 A1 | 6/2016 | Hsu |
| 2016/0190054 A1 | 6/2016 | Park |
| 2016/0329298 A1 | 11/2016 | Lee |
| 2016/0329299 A1 | 11/2016 | Lin |
| 2017/0221866 A1 | 8/2017 | Cho |
| 2018/0040578 A1 | 2/2018 | Yu |
| 2019/0259726 A1 | 8/2019 | Jeng |
| 2020/0051918 A1 | 2/2020 | Bae |
| 2020/0203279 A1 | 6/2020 | Ha |
| 2021/0028145 A1 | 1/2021 | Yu |
| 2021/0066093 A1 | 3/2021 | Kim |
| 2021/0134757 A1 | 5/2021 | Gandhi |
| 2021/0225805 A1 | 7/2021 | Watanabe |
| 2021/0257305 A1 | 8/2021 | Mm |
| 2021/0272929 A1 | 9/2021 | Tsai |
| 2021/0296249 A1 | 9/2021 | Khim |
| 2021/0343651 A1* | 11/2021 | Tsai ................... H01L 21/6835 |
| 2021/0407911 A1 | 12/2021 | Park |
| 2022/0013474 A1 | 1/2022 | Yoo |
| 2022/0173082 A1 | 6/2022 | Kim |
| 2022/0285328 A1 | 9/2022 | Kim |
| 2023/0023672 A1 | 1/2023 | Kwon |
| 2023/0178502 A1 | 6/2023 | Goh |

FOREIGN PATENT DOCUMENTS

| | | |
|---|---|---|
| KR | 10-2021-0021257 A | 2/2021 |
| TW | 200715425 | 4/2007 |
| TW | 201044546 A1 | 12/2010 |
| TW | 201709450 A | 3/2017 |
| TW | 201832410 A | 9/2018 |
| TW | 202109801 A | 3/2021 |
| TW | 202212427 A | 4/2022 |
| TW | 202220123 A | 5/2022 |

OTHER PUBLICATIONS

Yu, the specification, including the claims, and drawings in the U.S. Appl. No. 18/106,499 , filed Feb. 7, 2023.

* cited by examiner

PACKAGE-ON-PACKAGE HAVING A THICK LOGIC DIE

CROSS REFERENCE TO RELATED APPLICATION

This application is a continuation-in-part of U.S. application Ser. No. 18/107,520, filed on Feb. 9, 2023, which claims the benefit of U.S. Provisional Application No. 63/316,004, filed on Mar. 3, 2022. Further, this application claims the benefit of U.S. Provisional Application No. 63/354,361, filed on Jun. 22, 2022. Further, this application claims the benefit of U.S. Provisional Application No. 63/354,363, filed on Jun. 22, 2022. The contents of these applications are incorporated herein by reference.

BACKGROUND

The present disclosure generally relates to the field of semiconductor packaging. More particularly, the present disclosure relates to a multi-chip module (MCM) package-on-package having a thick logic die.

Package-on-Package (PoP) is an integrated circuit packaging method to combine vertically discrete logic and memory ball grid array (BGA) packages. Two or more packages are installed atop each other, i.e. stacked, with a standard interface to route signals between them. This allows higher component density in devices, such as mobile phones or digital cameras.

PoP solutions are commonly used in baseband and applications processors in mobile phones. High-end phones have seen the fastest adoption of PoP packaging to provide high I/O and performance requirements. The main advantage of stacked PoP is that devices can be separately fully tested before assembly.

With development of the semiconductor industry, many studies are being conducted to improve reliability and durability of the semiconductor packages. An improvement of the PoP structure becomes very important and imperative.

SUMMARY

It is one object of the present disclosure to provide an improved package-on-package in order to solve the above-mentioned prior art deficiencies or shortcomings.

One aspect of the present disclosure provides a package-on-package, comprising a first package and a second package stacked on the first package. The first package comprises a bottom substrate and a top substrate space apart from the bottom substrate such that the bottom substrate and the top substrate define a gap therebetween; a logic die and at least one integrated circuit device mounted on a top surface of the bottom substrate in a side-by-side configuration, wherein the logic die has a thickness not less than 125 micrometer; a plurality of copper cored solder balls disposed between the bottom substrate and the top substrate around the logic die and the at least one integrated circuit device to electrically connect the bottom substrate with the top substrate; and a sealing resin filling in the gap between the bottom substrate and the top substrate and sealing the logic die, the at least one integrated circuit device, and the plurality of copper cored solder balls in the gap.

According to some embodiments, the logic die comprises an application processor die or a SOC die.

According to some embodiments, the logic die has a thickness of 125-750 micrometers.

According to some embodiments, the logic die is mounted on the top surface of the bottom substrate in a flip-chip fashion.

According to some embodiments, the logic die comprises an active front side and a passive rear side, and wherein, a plurality of input/output (I/O) pads is provided on the active front side, and the logic die is electrically connected to the bottom substrate through a plurality of conductive elements formed on the plurality of I/O pads, respectively.

According to some embodiments, each of the bottom substrate and the top substrate comprises a printed wiring board, an interposer substrate, a re-distribution layer (RDL) substrate, or a package substrate.

According to some embodiments, the gap has a gap height not less than 160 micrometers.

According to some embodiments, the gap has a gap height ranging between 160-1000 micrometers.

According to some embodiments, an aspect ratio of the plurality of copper cored solder balls ranges between 1.1-2.0.

According to some embodiments, a ball pitch of the plurality of copper cored solder balls is 0.2-0.3 mm.

According to some embodiments, external connection terminals are disposed on a bottom surface of the bottom substrate.

According to some embodiments, the second package is a memory package.

According to some embodiments, the memory package comprises a LPDDR DRAM package.

According to some embodiments, the at least one integrated circuit device comprise at least one of a modem, a memory known-good die, a power management IC, and an RF die.

According to some embodiments, the logic die comprises an application processor die, and the at least one integrated circuit device comprises a modem die and a memory known-good die; and wherein the memory known-good die is stacked on the modem die, or the modem die and the memory known-good die are arranged in a side-by-side configuration.

According to some embodiments, the logic die comprises an application processor die, and the at least one integrated circuit device comprises a modem die.

According to some embodiments, the logic die comprises a SOC die, and the at least one integrated circuit device comprises a power management IC.

According to some embodiments, the logic die comprises a SOC die, and the at least one integrated circuit device comprises an RF die.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and, together with the description, serve to explain the principles of the present disclosure. In the drawings.

DETAILED DESCRIPTION

In the following detailed description of embodiments of the present disclosure, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present disclosure is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 1:
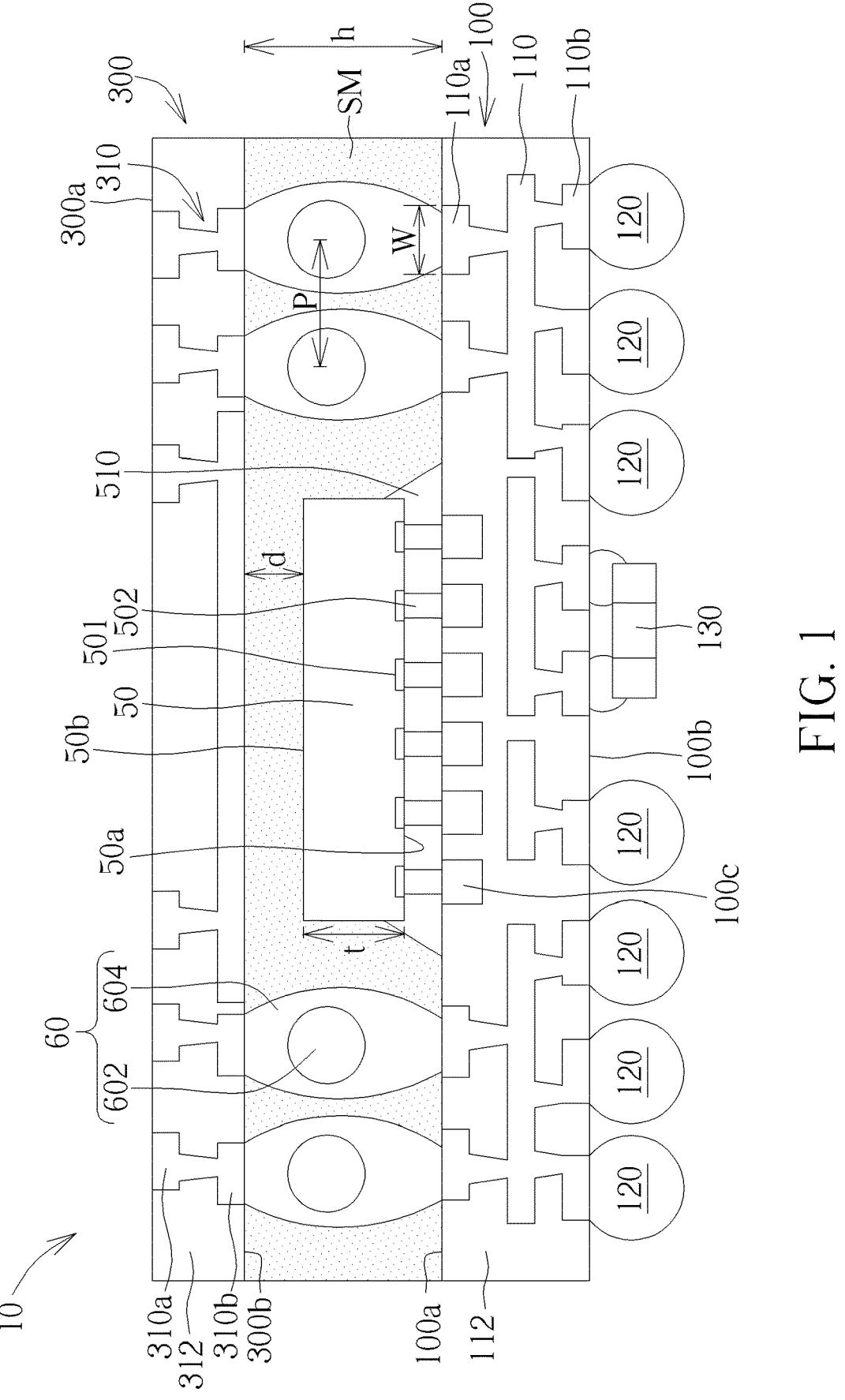
FIG. 1 is a schematic, cross-sectional diagram showing an exemplary semiconductor package having thick logic die in accordance with an embodiment of the present disclosure.

FIG. 1 is a schematic, cross-sectional diagram showing an exemplary semiconductor package having thick logic die in accordance with an embodiment of the present disclosure. As shown in FIG. 1, the semiconductor package 10 comprises a bottom substrate 100 having a top surface 100*a* and an opposing bottom surface 100*b*. According to an embodiment, the bottom substrate 100 may be a printed wiring board or a package substrate having a plurality of conductive interconnect structures 110 and at least an insulating layer 112. According to an embodiment, the conductive interconnect structures 110 may comprise a plurality of pad patterns 110*a* and 110*c* distributed on the top surface 100*a* and a plurality of pad patterns 110*b* distributed on the bottom surface 100*b*.

According to an embodiment, a logic die 50 is mounted on the pad patterns 110*c* on the top surface 100*a* of the bottom substrate 100 in a flip-chip fashion. According to an embodiment, the logic die 50 may be an application processor die or a baseband processor die, but is not limited thereto. According to an embodiment, the logic die 50 has a thickness t ranging between 125-350 micrometers, for example, 170 micrometers, which is thicker than a normal logic die (has a thickness of about 80 micrometer) used in high-end mobile devices such as high-end mobile phones.

According to an embodiment, the logic die 50 has an active front side 50*a* and a passive rear side 50*b*. According to an embodiment, a plurality of input/output (I/O) pads 501 is provided on the active front side 50*a*. According to an embodiment, the logic die 50 is electrically connected to the pad patterns 110*c* of the bottom substrate 100 through a plurality of conductive elements 502 such as solder bumps, metal bumps, micro-bumps, or pillars, which are formed on the plurality of I/O pads 501, respectively. According to an embodiment, underfill resin 510 may be injected into a space between the logic die 50 and the top surface 100*a* of the bottom substrate 100. According to an embodiment, the conductive elements 502 are surrounded by the underfill resin 510. According to some embodiments, for example, the I/O pads 501 may be fanned out at the active front side 50*a* by using techniques known in the art, for example, a re-distribution layer (RDL) structure.

According to an embodiment, the logic die 50 is disposed between the bottom substrate 100 and a top substrate 300. According to an embodiment, the top substrate 300 may be a printed wiring board, an interposer substrate, or a package substrate having a plurality of conductive interconnect structures 310 and at least an insulating layer 312. According to an embodiment, the conductive interconnect structures 310 may comprise a plurality of pad patterns 310*a* distributed on the top surface 300*a* and a plurality of pad patterns 310*b* distributed on the bottom surface 300*b*. According to an embodiment, a plurality of copper cored solder balls 60 or other more ductility metal connection is disposed on the pad patterns 310*b* distributed on the bottom surface 300*b* of the top substrate 300, respectively.

According to an embodiment, the bottom substrate 100 is connected electrically with the top substrate 300 via the copper cored solder balls 60 around the logic die 50. The sealing resin SM is filled into a gap having a gap height h between the bottom substrate 100 and the top substrate 300. According to an embodiment, the gap height h may range between 160-450 micrometers in 0.2-0.3 mm ball pitch range, but is not limited thereto. According to an embodiment, the pad patterns 110*a*, on which the copper cored solder balls 60 are attached, have a width w ranging between 100-300 micrometers, but is not limited thereto. According to an embodiment, an aspect ratio of the copper cored solder ball 60 may range between 1.1-2.0, for example, 1.44. According to an embodiment, a ball pitch P of the copper cored solder balls 60 may be 0.2-0.3 mm.

According to an embodiment, the sealing resin SM surrounds the copper cored solder balls 60 and covers the passive rear side 50*b* and sidewalls of the logic die 50. According to an embodiment, the sealing resin SM is in direct contact with the bottom surface 300*b* of the top substrate 300, the side surface of the underfill resin 510 and the top surface 100*a* of the bottom substrate 100. The gap between the bottom substrate 100 and the top substrate 300 is sealed with the sealing resin SM. The distance d between the passive rear side 50*b* of the logic die 50 and the bottom surface 300*b* of the top substrate 300 may be equal to or greater than 30 micrometers.

According to an embodiment, each of the copper cored solder balls 60 may comprise a copper core 602 having a diameter of about 10 micrometers, which is coated with a solder layer 604. The copper cored solder balls 60 are joined to the bottom substrate 100 and the top substrate 300. According to an embodiment, the copper core 602 is formed of copper or copper alloys and shaped into a solid sphere. According to an embodiment, the top substrate 300 having the copper cored solder balls 60 may be mounted onto the top surface 100*a* of the bottom substrate 100 by using a thermal compression bonding (TCB) method.

According to an embodiment, external connection terminals 120 such as solder balls or BGA balls are joined to the pad patterns 110b on the bottom surface 100b of the bottom substrate 100 for further connection with a mother board or a system board. According to an embodiment, a surface mount device 130 such as a capacitor or a resistor may be mounted on the bottom surface 100b of the bottom substrate 100.

Figure 2:
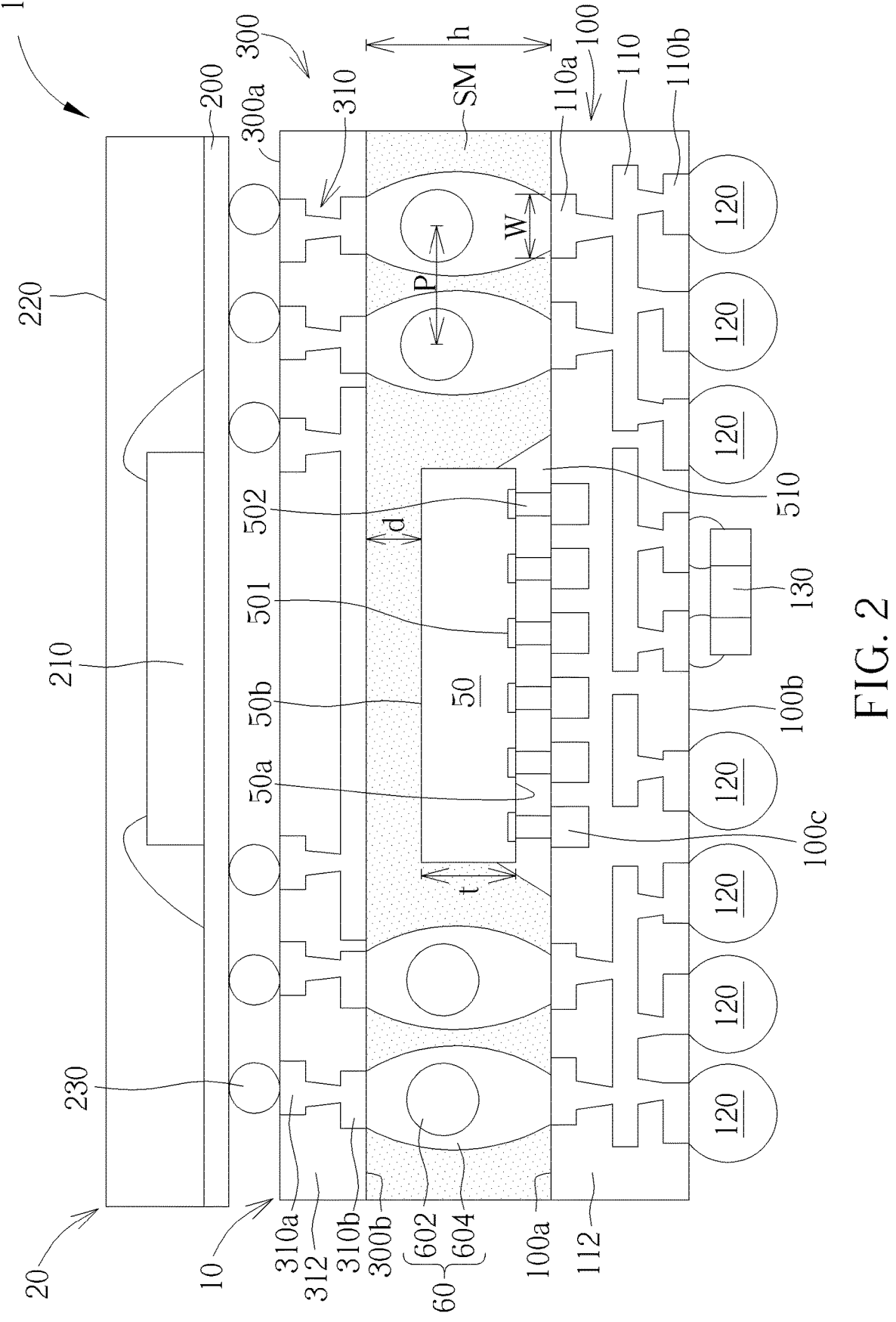
FIG. 2 is a schematic, cross-sectional diagram showing an exemplary package-on-package (PoP) having thick logic die in accordance with an embodiment of the present disclosure.

FIG. 2 is a schematic, cross-sectional diagram showing an exemplary package-on-package (PoP) having thick logic die in accordance with an embodiment of the present disclosure, wherein like layers, regions or elements are designated by like numeral numbers or labels. As shown in FIG. 2, the PoP 1 such as a high-bandwidth PoP (HBPoP) may comprise the semiconductor package 10 as set forth in FIG. 1 and a memory package 20 such as a LPDDR DRAM package stacked on the semiconductor package 10. According to an embodiment, the memory package 20 may comprise a substrate 200, a memory die 210 mounted on the substrate 200, and a molding compound 220 encapsulating the memory die 210. According to an embodiment, the memory package 20 may be electrically connected to the semiconductor package 10 through a plurality of conductive elements 230 such as solder balls or bumps.

Figure 3:
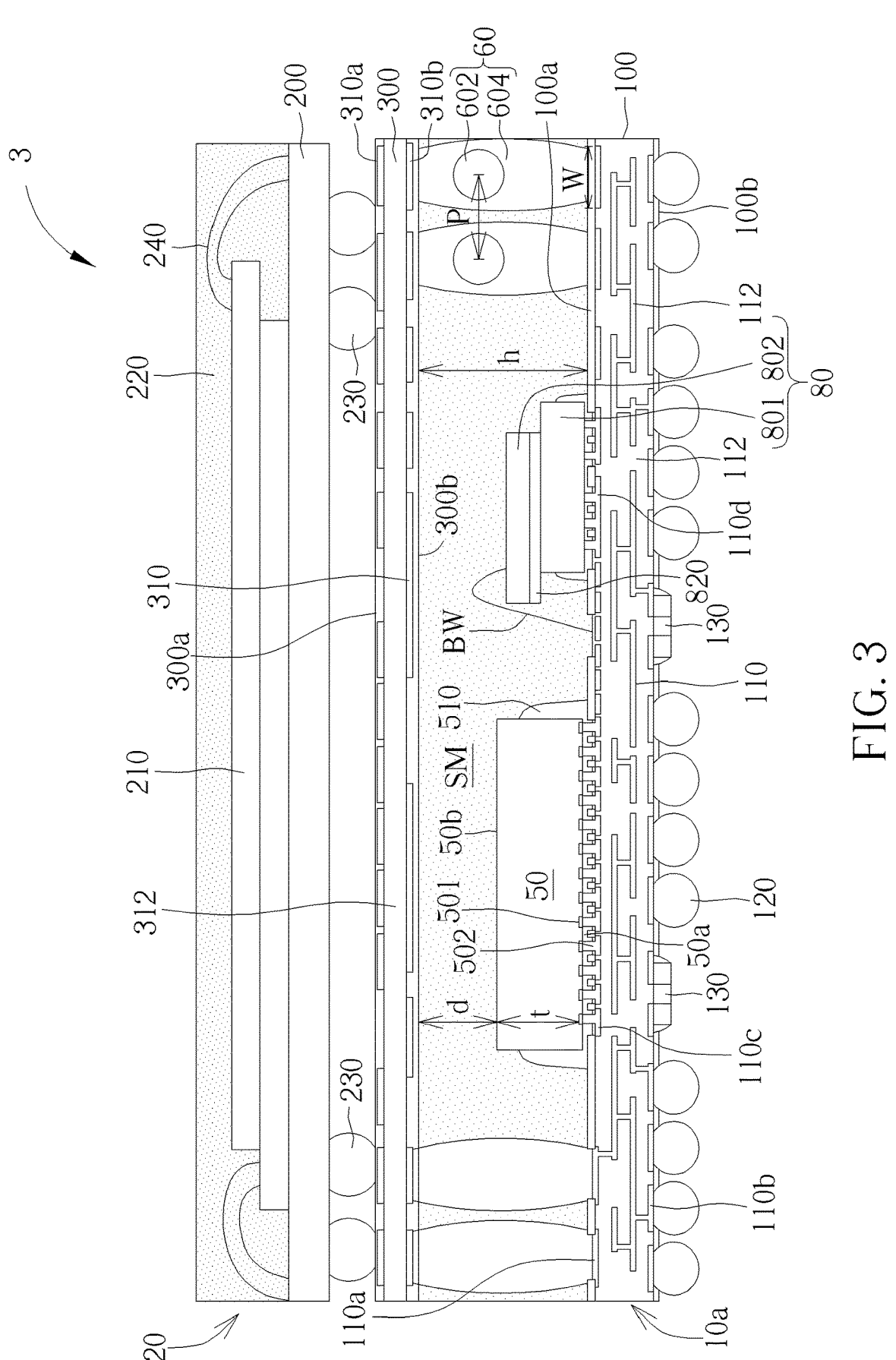
FIG. 3 is a schematic, cross-sectional diagram showing an exemplary package-on-package (PoP) having thick logic die in accordance with another embodiment of the present disclosure.

FIG. 3 is a schematic, cross-sectional diagram showing an exemplary package-on-package (PoP) having thick logic die in accordance with another embodiment of the present disclosure, wherein like layers, regions or elements are designated by like numeral numbers or labels. As shown in FIG. 3, the PoP 3 such as a high-bandwidth PoP (HBPoP) may comprise a semiconductor package 10a and a memory package 20 such as a LPDDR DRAM package stacked on the semiconductor package 10a. According to an embodiment, the memory package 20 may comprise a substrate 200, a memory die 210 mounted on the substrate 200, and a molding compound 220 encapsulating the memory die 210. According to an embodiment, the memory package 20 may be electrically connected to the semiconductor package 10a through the plurality of conductive elements 230 such as solder balls or bumps.

According to an embodiment, likewise, the semiconductor package 10a comprises a bottom substrate 100 having a top surface 100a and an opposing bottom surface 100b. According to an embodiment, the bottom substrate 100 may be a printed wiring board, an interposer substrate, a re-distribution layer (RDL) substrate, or a package substrate having a plurality of conductive interconnect structures 110 and at least an insulating layer 112. According to an embodiment, the conductive interconnect structures 110 may comprise a plurality of pad patterns 110a, 110c, and 110d, and a plurality of pad patterns 110b, wherein the plurality of pad patterns 110a, 110c, and 110d are distributed on the top surface 100a, and the plurality of pad patterns 110b are distributed on the bottom surface 100b.

According to an embodiment, a logic die 50 is mounted on the pad patterns 110c on the top surface 100a of the bottom substrate 100 in a flip-chip fashion. According to an embodiment, the logic die 50 may be an application processor die, but is not limited thereto. According to an embodiment, the logic die 50 has a thickness t, wherein t is not less than 125 micrometers, for example, t may be between 125-750 micrometers. According to an embodiment, t is 170 micrometers, which is thicker than a normal logic die (has a thickness of about 80 micrometer) used in high-end mobile devices such as high-end mobile phones. According to an embodiment, the logic die 50 has an active front side 50a and a passive rear side 50b. According to an embodiment, a plurality of input/output (I/O) pads 501 is provided on the active front side 50a. According to an embodiment, the logic die 50 is electrically connected to the pad patterns 110c of the bottom substrate 100 through a plurality of conductive elements 502 such as solder bumps, metal bumps, micro-bumps, or pillars, which are formed on the plurality of I/O pads 501, respectively. According to an embodiment, underfill resin 510 may be injected into a space between the logic die 50 and the top surface 100a of the bottom substrate 100. According to an embodiment, the conductive elements 502 are surrounded by the underfill resin 510.

According to an embodiment, an integrated circuit device 80 is mounted in proximity to the logic die 50. According to an embodiment, the integrated circuit device 80 and the logic die 50 are arranged in a side-by-side configuration. According to an embodiment, the integrated circuit device 80 may comprise a modem die 801 and a memory known-good die 802 stacked on the modem die 801. According to an embodiment, the modem die 801 is mounted on the pad patterns 110d of the bottom substrate 100 in a flip-chip fashion. The memory known-good die 802 may be mounted on the modem die 801 with an adhesive layer 820 and may be electrically connected to the bottom substrate 100 through a plurality of bond wires BW. According to an embodiment, the integrated circuit device 80 may communicate with the logic die 50 through the bottom substrate 100.

It is advantageous to use this embodiment because the modem die 801 and the application processor 50 are mounted on the same bottom substrate 100, better communication between them can be achieved. Furthermore, in this embodiment, the logic die 50 is an application processor instead of SOC die, the cost can be benefits by increase of gross die per wafer and improved yield with smaller die.

According to an embodiment, the logic die 50 and the integrated circuit device 80 are disposed between the bottom substrate 100 and a top substrate 300. According to an embodiment, the top substrate 300 may be a printed wiring board, an interposer substrate, a re-distribution layer (RDL) substrate, or a package substrate having a plurality of conductive interconnect structures 310 and at least an insulating layer 312. According to an embodiment, the conductive interconnect structures 310 may comprise a plurality of pad patterns 310a distributed on the top surface 300a and a plurality of pad patterns 310b distributed on the bottom surface 300b. According to an embodiment, a plurality of copper cored solder balls 60 or other more ductility metal connection is disposed on the pad patterns 310b distributed on the bottom surface 300b of the top substrate 300, respectively.

According to an embodiment, the bottom substrate 100 is connected electrically with the top substrate 300 via the copper cored solder balls 60 around the logic die 50 and the integrated circuit device 80. The sealing resin SM is filled into a gap having a gap height h between the bottom substrate 100 and the top substrate 300. According to an embodiment, the gap height h is not less than 160 micrometers, for example, h may range between 160-1000 micrometers, but is not limited thereto. According to an embodiment, the pad patterns 110a, on which the copper cored solder balls 60 are attached, have a width w ranging between 100-300 micrometers, but is not limited thereto. According to an embodiment, an aspect ratio of the copper cored solder ball 60 may range between 1.1-2.0, for example, 1.44. According to an embodiment, a ball pitch P of the copper cored solder balls 60 may be 0.2-0.3 mm.

According to an embodiment, the sealing resin SM surrounds the copper cored solder balls 60 and covers the passive rear side 50b and sidewalls of the logic die 50 and the integrated circuit device 80. According to an embodiment, the sealing resin SM is in direct contact with the bottom surface 300b of the top substrate 300, the side surface of the underfill resin 510 and the top surface 100a of the bottom substrate 100. The gap between the bottom substrate 100 and the top substrate 300 is sealed with the sealing resin SM. The distance d between the passive rear side 50b of the logic die 50 and the bottom surface 300b of the top substrate 300 may be equal to or greater than 30 micrometers.

According to an embodiment, each of the copper cored solder balls 60 may comprise a copper core 602 having a diameter of about 10 micrometers, which is coated with a solder layer 604. The copper cored solder balls 60 are joined to the bottom substrate 100 and the top substrate 300. According to an embodiment, the copper core 602 is formed of copper or copper alloys and shaped into a solid sphere. According to an embodiment, the top substrate 300 having the copper cored solder balls 60 may be mounted onto the top surface 100a of the bottom substrate 100 by using a thermal compression bonding (TCB) method.

According to an embodiment, likewise, external connection terminals 120 such as solder balls or BGA balls are joined to the pad patterns 110b on the bottom surface 100b of the bottom substrate 100 for further connection with a mother board or a system board. According to an embodiment, a surface mount device 130 such as a capacitor or a resistor may be mounted on the bottom surface 100b of the bottom substrate 100.

Figure 4:
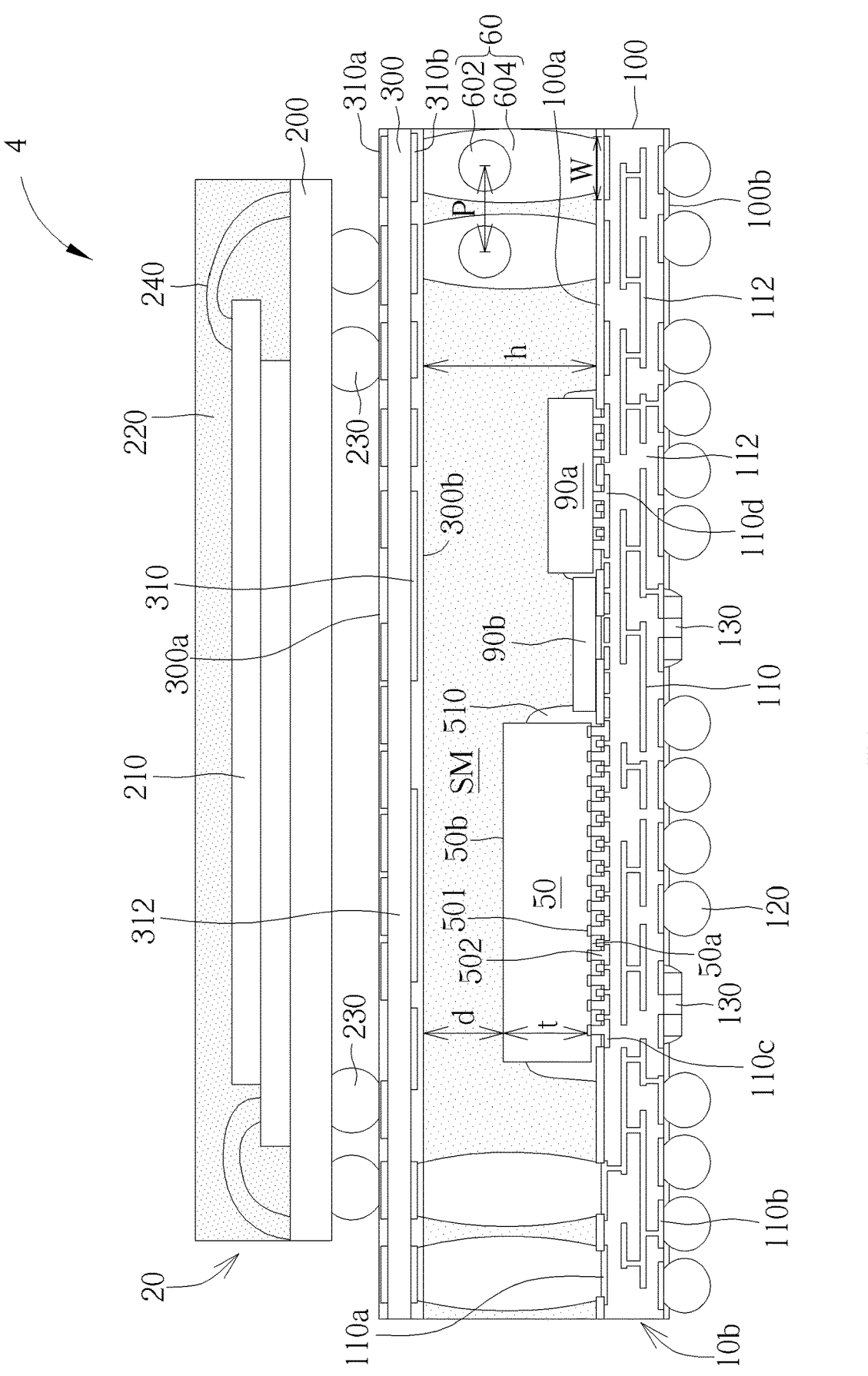
FIG. 4 is a schematic, cross-sectional diagram showing an exemplary package-on-package (PoP) having thick logic die in accordance with still another embodiment of the present disclosure.

FIG. 4 is a schematic, cross-sectional diagram showing an exemplary package-on-package (PoP) having thick logic die in accordance with still another embodiment of the present disclosure, wherein like layers, regions or elements are designated by like numeral numbers or labels. As shown in FIG. 4, the PoP 4 such as a high-bandwidth PoP (HBPoP) may comprise the semiconductor package 10b and a memory package 20 such as a LPDDR DRAM package stacked on the semiconductor package 10b. According to an embodiment, the memory package 20 may comprise a substrate 200, a memory die 210 mounted on the substrate 200, and a molding compound 220 encapsulating the memory die 210. According to an embodiment, the memory package 20 may be electrically connected to the semiconductor package 10b through a plurality of conductive elements 230 such as solder balls or bumps.

According to an embodiment, likewise, the semiconductor package 10b comprises a bottom substrate 100 having a top surface 100a and an opposing bottom surface 100b. According to an embodiment, the bottom substrate 100 may be a printed wiring board, an interposer substrate, a re-distribution layer (RDL) substrate, or a package substrate having a plurality of conductive interconnect structures 110 and at least an insulating layer 112. According to an embodiment, the conductive interconnect structures 110 may comprise a plurality of pad patterns 110a, 110c, and 110d distributed on the top surface 100a and a plurality of pad patterns 110b distributed on the bottom surface 100b.

According to an embodiment, a logic die 50 is mounted on the pad patterns 110c on the top surface 100a of the bottom substrate 100 in a flip-chip fashion. According to an embodiment, the logic die 50 may be an application processor die or a SOC die (usually integrates an application processor and a modem), but is not limited thereto. According to an embodiment, the logic die 50 has a thickness t, wherein t is not less than 125 micrometers, for example, t is between 125-750 micrometers. According to an embodiment, t is 170 micrometers, which is thicker than a normal logic die (has a thickness of about 80 micrometer) used in high-end mobile devices such as high-end mobile phones. According to an embodiment, the logic die 50 has an active front side 50a and a passive rear side 50b. According to an embodiment, a plurality of input/output (I/O) pads 501 is provided on the active front side 50a. According to an embodiment, the logic die 50 is electrically connected to the pad patterns 110c of the bottom substrate 100 through a plurality of conductive elements 502 such as solder bumps, metal bumps, micro-bumps, or pillars, which are formed on the plurality of I/O pads 501, respectively. According to an embodiment, underfill resin 510 may be injected into a space between the logic die 50 and the top surface 100a of the bottom substrate 100. According to an embodiment, the conductive elements 502 are surrounded by the underfill resin 510.

According to an embodiment, at least one integrated circuit device may be mounted in proximity to the logic die 50 on the top surface 100a of the bottom substrate 100. The at least one integrated circuit device and the logic die 50 are arranged in a side-by-side configuration. For example, but not limited to, the at least one integrated circuit device may comprise at least one of a modem, a memory known-good die, a power management IC, and an RF die. According to an embodiment, multiple integrated circuit devices 90a and 90b may be mounted in proximity to the logic die 50 on the top surface 100a of the bottom substrate 100. According to an embodiment, wherein the logic die 50 may be an application processor die, and the integrated circuit devices 90a and 90b may be a modem and a memory known-good die, respectively. According to another embodiment, an integrated circuit devices 90a may be mounted in proximity to the logic die 50 on the top surface 100a of the bottom substrate 100, wherein the logic die 50 may be an application processor die, and the integrated circuit device 90a may be a modem or a memory known-good die. According to another embodiment, an integrated circuit devices 90a may be mounted in proximity to the logic die 50 on the top surface 100a of the bottom substrate 100, wherein the logic die 50 may be a SOC die, and the integrated circuit device 90a may be a power management IC, an RF die. According to another embodiment, the integrated circuit devices 90a and 90b may be mounted in proximity to the logic die 50 on the top surface 100a of the bottom substrate 100, wherein the logic die 50 may be a SOC die, and the integrated circuit devices 90a and 90b may be a power management IC and an RF die, respectively.

According to an embodiment, the integrated circuit devices 90a, 90b may be mounted on the pad patterns 110d of the bottom substrate 100 in a flip-chip fashion. According to an embodiment, the integrated circuit devices 90a, 90b may communicate with the logic die 50 through the bottom substrate 100.

According to an embodiment, the logic die 50 and the integrated circuit devices 90a, 90b are disposed between the bottom substrate 100 and a top substrate 300. According to an embodiment, the top substrate 300 may be a printed wiring board, an interposer substrate, a re-distribution layer (RDL) substrate, or a package substrate having a plurality of conductive interconnect structures 310 and at least an insulating layer 312. According to an embodiment, the conductive interconnect structures 310 may comprise a plurality of pad patterns 310a distributed on the top surface 300a and a plurality of pad patterns 310b distributed on the bottom surface 300b. According to an embodiment, a plurality of copper cored solder balls 60 or other more ductility metal connection is disposed on the pad patterns 310b distributed on the bottom surface 300b of the top substrate 300, respectively.

According to an embodiment, the bottom substrate 100 is connected electrically with the top substrate 300 via the copper cored solder balls 60 around the logic die 50 and the integrated circuit device 80. The sealing resin SM is filled into a gap having a gap height h between the bottom substrate 100 and the top substrate 300. According to an embodiment, the gap height h may range between 160-450 micrometers in 0.2-0.3 mm ball pitch range, but is not limited thereto. According to an embodiment, the pad patterns 110a, on which the copper cored solder balls 60 are attached, have a width w ranging between 100-300 micrometers, but is not limited thereto. According to an embodiment, an aspect ratio of the copper cored solder ball 60 may range between 1.1-2.0, for example, 1.44. According to an embodiment, a ball pitch P of the copper cored solder balls 60 may be 0.2-0.3 mm.

According to an embodiment, the sealing resin SM surrounds the copper cored solder balls 60 and covers the passive rear side 50b and sidewalls of the logic die 50 and the integrated circuit devices 90a, 90b. According to an embodiment, the sealing resin SM is in direct contact with the bottom surface 300b of the top substrate 300, the side surface of the underfill resin 510 and the top surface 100a of the bottom substrate 100. The gap between the bottom substrate 100 and the top substrate 300 is sealed with the sealing resin SM. The distance d between the passive rear side 50b of the logic die 50 and the bottom surface 300b of the top substrate 300 may be equal to or greater than 30 micrometers.

According to an embodiment, each of the copper cored solder balls 60 may comprise a copper core 602 having a diameter of about 10 micrometers, which is coated with a solder layer 604. The copper cored solder balls 60 are joined to the bottom substrate 100 and the top substrate 300. According to an embodiment, the copper core 602 is formed of copper or copper alloys and shaped into a solid sphere. According to an embodiment, the top substrate 300 having the copper cored solder balls 60 may be mounted onto the top surface 100a of the bottom substrate 100 by using a thermal compression bonding (TCB) method.

According to an embodiment, likewise, external connection terminals 120 such as solder balls or BGA balls are joined to the pad patterns 110b on the bottom surface 100b of the bottom substrate 100 for further connection with a mother board or a system board. According to an embodiment, a surface mount device 130 such as a capacitor or a resistor may be mounted on the bottom surface 100b of the bottom substrate 100.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. A package-on-package, comprising a first package and a second package stacked on the first package, wherein the first package comprises:

a bottom substrate and a top substrate space apart from the bottom substrate such that the bottom substrate and the top substrate define a gap therebetween;

a logic die and at least one integrated circuit device mounted on a top surface of the bottom substrate in a side-by-side configuration, wherein the logic die has a thickness not less than 125 micrometer;

a plurality of copper cored solder balls disposed between the bottom substrate and the top substrate around the logic die and the at least one integrated circuit device to electrically connect the bottom substrate with the top substrate; and a sealing resin filling in the gap between the bottom substrate and the top substrate and sealing the logic die, the at least one integrated circuit device, and the plurality of copper cored solder balls in the gap, wherein the logic die comprises an application processor die, and the at least one integrated circuit device comprises a modem die and a memory known-good die; and wherein the memory known-good die is stacked on the modem die, or the modem die and the memory known-good die are arranged in a side-by-side configuration.

2. The package-on-package according to claim 1, wherein the logic die has a thickness of 125-750 micrometers.

3. The package-on-package according to claim 1, wherein the logic die is mounted on the top surface of the bottom substrate in a flip-chip fashion.

4. The package-on-package according to claim 3, wherein the logic die comprises an active front side and a passive rear side, and wherein, a plurality of input/output (I/O) pads is provided on the active front side, and the logic die is electrically connected to the bottom substrate through a plurality of conductive elements formed on the plurality of I/O pads, respectively.

5. The package-on-package according to claim 1, wherein each of the bottom substrate and the top substrate comprises a printed wiring board, an interposer substrate, a re-distribution layer (RDL) substrate, or a package substrate.

6. The package-on-package according to claim 1, wherein the gap has a gap height not less than 160 micrometers.

7. The package-on-package according to claim 6, wherein the gap has a gap height ranging between 160-1000 micrometers.

8. The package-on-package according to claim 1, wherein an aspect ratio of the plurality of copper cored solder balls ranges between 1.1-2.0.

9. The package-on-package according to claim 1, wherein a ball pitch of the plurality of copper cored solder balls is 0.2-0.3 mm.

10. The package-on-package according to claim 1, wherein external connection terminals are disposed on a bottom surface of the bottom substrate.

11. The package-on-package according to claim 1, wherein the second package is a memory package.

12. The package-on-package according to claim 11, wherein the memory package comprises a LPDDR DRAM package.

* * * * *